United States Patent
Narita et al.

(10) Patent No.: US 7,471,095 B2
(45) Date of Patent: Dec. 30, 2008

(54) ELECTRICAL CONNECTING APPARATUS AND METHOD FOR USE THEREOF

(75) Inventors: Satoshi Narita, Aomori (JP); Yoko Ichinohe, Aomori (JP); Nobuyuki Yamaguchi, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/939,495

(22) Filed: Nov. 13, 2007

(65) Prior Publication Data

US 2008/0143369 A1    Jun. 19, 2008

(30) Foreign Application Priority Data

Dec. 19, 2006   (JP)   ............................. 2006-340933

(51) Int. Cl.
     *G01R 31/02*     (2006.01)
(52) U.S. Cl. ........................... 324/754; 324/758
(58) Field of Classification Search ................ 324/754, 324/758, 762, 761
See application file for complete search history.

(56) References Cited

U.S. PATENT DOCUMENTS

| | | | |
|---|---|---|---|
| 6,174,744 B1 * | 1/2001 | Watanabe et al. | 438/14 |
| 6,307,392 B1 * | 10/2001 | Soejima et al. | 324/762 |
| 6,741,086 B2 * | 5/2004 | Maekawa et al. | 324/754 |
| 6,870,381 B2 * | 3/2005 | Grube | 324/754 |
| 6,949,732 B2 * | 9/2005 | Kiguchi et al. | 250/216 |
| 6,956,389 B1 * | 10/2005 | Mai | 324/758 |
| 7,084,657 B2 * | 8/2006 | Matsumura | 324/762 |
| 7,109,731 B2 * | 9/2006 | Gleason et al. | 324/754 |
| 7,279,917 B2 * | 10/2007 | Williams et al. | 324/762 |
| 7,423,441 B2 * | 9/2008 | Kimoto | 324/762 |
| 2005/0212539 A1 * | 9/2005 | Chen et al. | 324/754 |

FOREIGN PATENT DOCUMENTS

| | | |
|---|---|---|
| JP | 2002-509604 | 3/2002 |
| JP | 2002-340932 | 11/2002 |
| JP | 2003-043064 | 2/2003 |
| JP | 2003-227849 | 8/2003 |
| WO | WO 97/43653 | 11/1997 |

\* cited by examiner

*Primary Examiner*—Ha Tran T Nguyen
*Assistant Examiner*—Richard Isla Rodas
(74) *Attorney, Agent, or Firm*—Ingrassia Fisher & Lorenz, P.C.

(57) ABSTRACT

An electrical connecting apparatus is used for electrical inspection of a device under test having electrodes each of which a recess is formed on a flat upside. The electrical connecting apparatus is provided with a plurality of probes, each probe including a base portion combined with a probe board, an elastically deformable arm portion extending above the electrodes of the device under test from the base portion along the probe board and at a distance therefrom, and a tip portion projecting from the arm portion in a direction to be away from the probe board. The front end of the tip portion of each probe can abut a flat surface area except the recess on the upside of the electrode in a state that no flexural deformation is caused in the arm portion. The electrical connecting apparatus is used so that, when an overdrive force toward the electrode acts on the probe to cause the arm portion a flexural deformation, the front end of the tip portion can move on the flat surface area without departing from the flat surface area.

6 Claims, 6 Drawing Sheets

ELECTRICAL CONNECTING APPARATUS AND METHOD FOR USE THEREOF

TECHNICAL FIELD

The present invention relates to an electrical connecting apparatus for use in an electrical inspection of a semiconductor IC chip or a semiconductor device such as a semiconductor wafer into which the semiconductor IC chips are assembled collectively.

BACKGROUND

A device under test such as a semiconductor device is subjected to an electrical test (inspection) as to whether or not it works as shown in a specification. In the device under test, an electrode such as, for example, a bump electrode is formed, and for its electrical test, the device under test is connected to a tester through an electrical connecting apparatus such as a probe card provided with probes (contacts) whose tips are pressed against the electrode.

There is such an electrical connecting apparatus comprising a probe board, a base portion combined with the probe board, an elastically deformable arm portion extending above the electrode of the device under test from the base portion along the probe board at a distance therefrom, and a tip portion projecting from the arm portion in a direction to be away from the probe board (see, e.g., Patent Documents 1 to 4).

[Patent Document 1] Japanese Patent Appln. Public Disclosure No. 2002-340932.

[Patent Document 2] Japanese Patent Appln. Public Disclosure No. 2003-43064.

[Patent Document 3] Japanese Patent Appln. Public Disclosure No. 2003-227849.

[Patent Document 4] National Patent Public Disclosure No. 2002-509604.

As an electrode to receive such a probe tip, there is a bump electrode 2 formed on a semiconductor wafer 1 as shown in FIG. 6(a). The upside 3 of the bump electrode 2 is flat except a recess 4 formed in the center. The peripheral wall 4a of the recess 4 is an inclined surface, and a frame-like flat surface area 3a surrounding the recess 4 is formed continuously on the inclined surface 4a.

Such a bump electrode 2 is formed by forming in general a mask for selectively exposing the area for the bump electrode 2 on the semiconductor wafer 1 with a photo resist and depositing a bump electrode material in the exposed area. At the time of depositing the bump electrode material, the recess 4 is undesirably formed.

Since the inclined surface 4a of the recess 4 as mentioned above hinders a stable electrical contact between the tip 5a of a probe 5 and the bump electrode 2, the probe 5 used to be disposed, as shown in FIG. 6(a), with its tip in correspondence to one half area on the side proximal to the probe 5 in the flat surface area 3a so as to make the tip 5a contact the flat surface area 3a of the bump electrode 2.

By this probe arrangement, as shown in FIG. 6(b), when the probe 5 is approached relatively to the bump electrode 2, the tip 5a contacts the flat surface area 3a. Thereafter, by further bringing the probe 5 relatively close to the bump electrode 2, as shown in FIG. 6(c), an overdrive force which may cause deflection to the arm portion 5b of the probe 5 acts on the probe 5, and therefore, with an elastic deformation of the arm portion 5b, the tip 5a of the probe 5 is caused displacement in an extending direction of the arm portion 5b, thereby sliding on the upside 3 of the bump electrode 2 to chip off. By the sliding of the tip 5a, a surface oxide film of the bump electrode 3 is partially removed, thereby ensuring a sure electrical contact between the bump electrode 3 and the tip 5a.

SUMMARY OF THE INVENTION

However, due to the movement of the tip 5a by the overdrive force, as shown in FIG. 6(c), in the conventional one, the tip 5a slides down from the flat surface area 3a onto the inclined surface 4a. The tip 5a which slid down onto the inclined surface 4a, when the overdrive force is canceled, returns to the contact position as shown in FIG. 6(b), following the restoration of the elastic deformation of the arm portion 5b. There was fear, however, that the edge 5c of the tip 5a may get stuck on a ridge between the inclined surface 4a of the bump electrode 2 and the flat surface area 3a, to scratch the ridge upward and chip off the ridge part.

When such chipping off of the bump electrode 2 is caused by the tip 5a, as shown in FIG. 6(a) by an imaginary line, shavings 6 from chipping adhere to the tip 5a. The shavings 6, when dropping down onto a new device under test 1 or its bump electrode 2, cause a short circuit.

Thus, an object of the present invention lies in preventing the tips pressed against the electrodes by the overdrive force acting on the probes from chipping off the ridge part on the upside of the electrodes.

DETAILED DESCRIPTION OF THE INVENTION

The present invention is used for an electrical inspection of a device under test having an electrode with a recess formed on the upside. The electrical connecting apparatus according to the present invention comprises: a plurality of probes, each of which has a base portion combined with a probe board; an elastically deformable arm portion extending above the electrode of the device under test from the base portion along the probe board at a distance from the probe board; and a tip portion projecting from the arm portion in a direction to be away from the probe board. The front end of the tip portion of each probe is capable of abutting the flat surface area except the recess of the upside in a state that no deformation flexural deformation is caused to the arm portion. In the electrical connecting apparatus, when flexural deformation is caused to the arm portion because of the overdrive force toward the electrode acting on the probe, the front end of the tip portion is used so as to move on the flat surface area without departing from the flat surface area.

In the electrical connecting apparatus and a method of using it according to the present invention, the front end of the probe is used to slide on the flat surface area of the electrode not to depart from the flat surface area, so that the probe does not pass the ridge of the electrode in a manner such as the conventional one when the probe moves on the flat surface area of the electrode and that there occurs no chipping off of this ridge part of the electrode.

The present invention is suitable for the device under test in which the electrode is a bump electrode.

The front end of the probe may be enabled to contact one half area of the upside located on a distal side from the base portion of the probe in a state that no deformation accompanying deflection is caused in the arm portion.

A longitudinal imaginary extension of the arm portion preferably intersects an axis passing substantially the center of the upside of the bump electrode.

When the recess is formed in the central portion of the upside of the electrode, the peripheral wall of the recess is inclined toward the bottom portion of the recess, and the flat surface area is formed like a frame to surround the inclined peripheral wall continuously to the inclined peripheral wall of the recess, then the front end can be moved on the flat surface area without moving to the inclined peripheral wall when the overdrive acts on the probe and when the overdrive force is cancelled.

The plural probes can be arranged such that the longitudinal direction of the arm portions is approximately orthogonal to the alignment direction of the tips so as to align the tips linearly and that the direction from the base portions of the respective probes toward the tips can be alternately reversed to the arrangement direction of the tips.

According to the present invention, as mentioned above, the probe tip does not pass the ridge part of the electrode, so that there occurs no chipping off of the ridge part of the electrode. Consequently, it is possible to prevent the ridge part from being damaged, and an electric short circuit caused by shavings can be surely prevented.

DETAILED DESCRIPTION OF THE INVENTION

Figure 1:
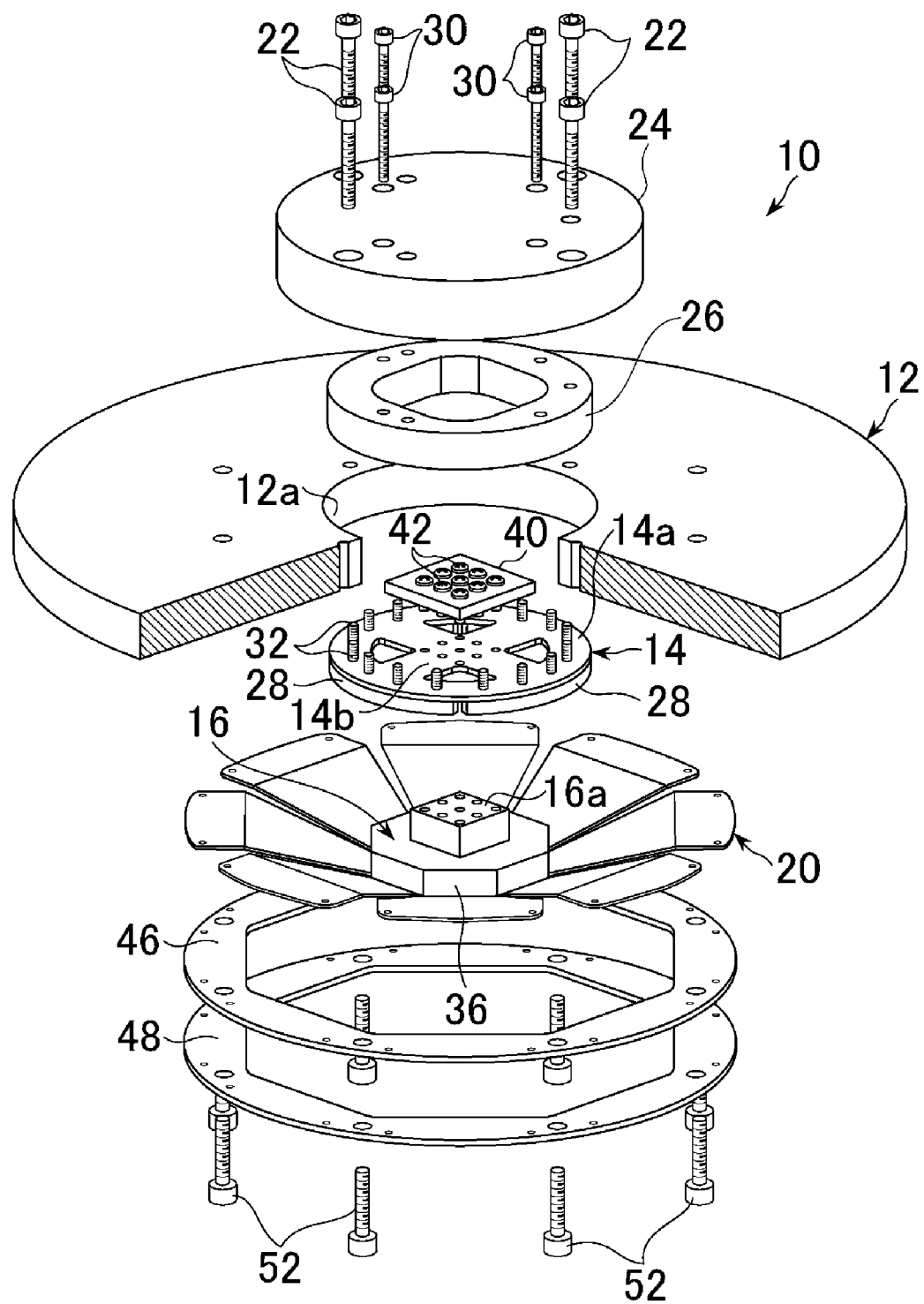
FIG. 1 is an exploded perspective view showing the electrical connecting apparatus according to the present invention.

The electrical connecting apparatus 10 according to the present invention comprises, as an exploded view of which is shown in FIG. 1: a rigid circuit board 12; a block 16 elastically supported on the rigid circuit board through a screw member 14; and a probe sheet 20 including a probe board 18 (see FIGS. 2 and 3) provided with a heretofore well-known plurality of conductive paths 18a (see FIG. 3) to be electrically connected to a plurality of wiring paths (not shown) within the rigid circuit board 12 respectively. In this embodiment, the probe board 18 according to the present invention is used as the central portion of the flexible probe sheet 20.

Figure 2:
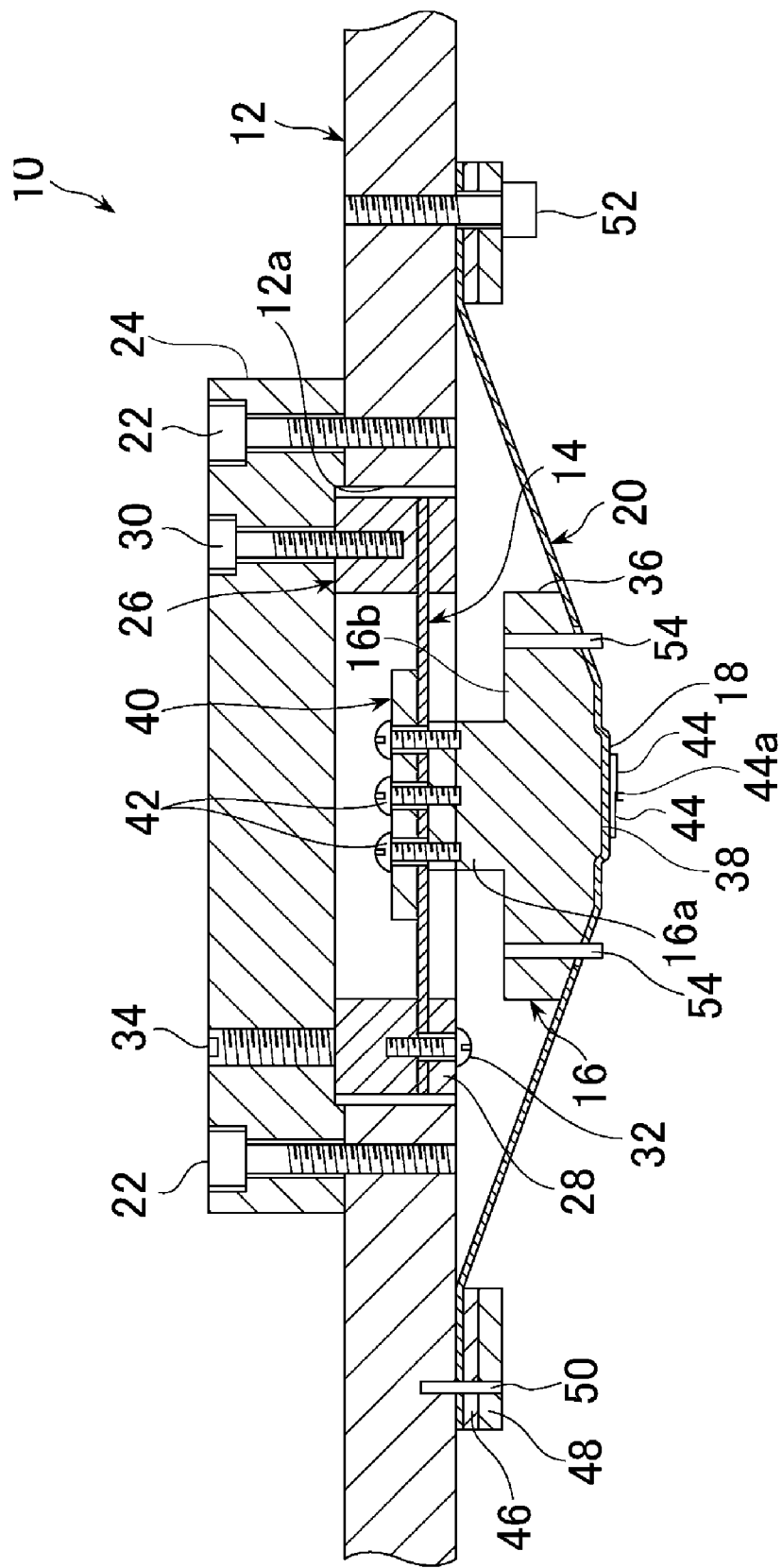
FIG. 2 is a sectional view showing the electrical connecting apparatus according to the present invention.

As is well known, a wiring path to be connected to an electric circuit of the tester body is formed within the rigid circuit board 12, and the rigid circuit board 12 has a circular opening 12a at its center. On the upside of the rigid circuit board 12, as shown in FIG. 2, a circular support plate 24 made of a metal such as stainless steel is fixed. The support plate 24 supports the rigid circuit board 12 and serves to reinforce the rigid circuit board.

The spring member 14 is made of a flat spring material, and held within the circular opening 12a of the rigid circuit board 12 across the opening through an annular mounting plate 26 which sandwiches the annular outer edge portion 14a (see FIG. 1) from both sides and a plurality of presser plates 28 combined to be annular with each other. For holding the spring member 14, the mounting plate 26 is joined to the underside of the support plate 24 by a bolt 30, and each presser plate 28 is joined to the mounting plate 26 by a bolt 32 penetrating the presser plate and the annular outer edge portion 14a of the spring member 14 and screwed into the mounting plate 26.

In the example shown in FIG. 2, a parallel adjusting screw member 34 for adjusting the holding attitude of the spring member 14 with the bolt 30 loosened is screwed into the support plate 24 so that the front end can contact the top surface of the mounting plate 26.

The above-mentioned block 16 is fixed on the body portion 14b (see FIG. 1) of the spring member 14 held within the circular opening 12a of the rigid circuit board 12. The block 16 includes a stem portion 16a having a rectangular transverse plane and a support portion 16b having a right octagonal cross sectional shape continuous to the lower end of the step portion. The support portion 16b is continued along its axis into a pedestal portion 36 having a certain diameter, and in the central portion of the pedestal portion is formed a flat support face 38.

As shown in FIG. 2, the block 16 is joined to the body portion 14b of the spring member 14 on the top surface of the stem portion 16a. For this joining, a fixing plate 40 to sandwich the body portion 14b in cooperation with the stem portion 16a is fixed to the step portion 16a by means of a screw member 42 screwed into the stem portion 16a.

The probe board 18 in the central portion of the probe sheet 20 is, as shown in FIG. 2, supported on the support surface 38 of the block 16, and a plurality of probes 44 are arranged substantially linearly to align their tips 44a.

In the example shown in FIG. 2, an elastic rubber ring 46 is disposed along the outer edge portion of the probe sheet 20 for joining thereto, and a ring metal fitting 48 for covering the elastic rubber ring 46. By tightening the screw member 52 penetrating the probe sheet 20 and both members 46, 48 to the rigid circuit board 12, the outer edge portion of the probe sheet 20 is combined with the rigid circuit board 12.

By joining the outer edge portion to the rigid circuit board 12, as heretofore, the conductive path 18a of the probe sheet 20 is electrically connected to the corresponding wiring path. Accordingly, each probe 44 is connected to the tester body through the conductive path 18a of the probe sheet 20 (probe board 18).

An alignment pin 54 is disposed, penetrating the probe sheet 20. At the lower end of the alignment pin 54, an alignment mark is formed. This alignment mark can be photographed from a camera (not shown) supported on a table (not shown) to hold a semiconductor wafer 56 (see FIGS. 3 and 4) which is the device under test.

From a photographed picture image of this alignment mark can be obtained a relative positional information of the electrical connecting apparatus 10 to the table, and, based on this positional information, the relative position of the electrical connecting apparatus 10 to the table is adjusted so that the tip 44a of each probe 44 of the electrical connecting apparatus 10 can contact each corresponding electrode 58 (see FIG. 3) of the device under test 56 on the table. This alignment pin 54 can be dispensed with.

Figure 3:
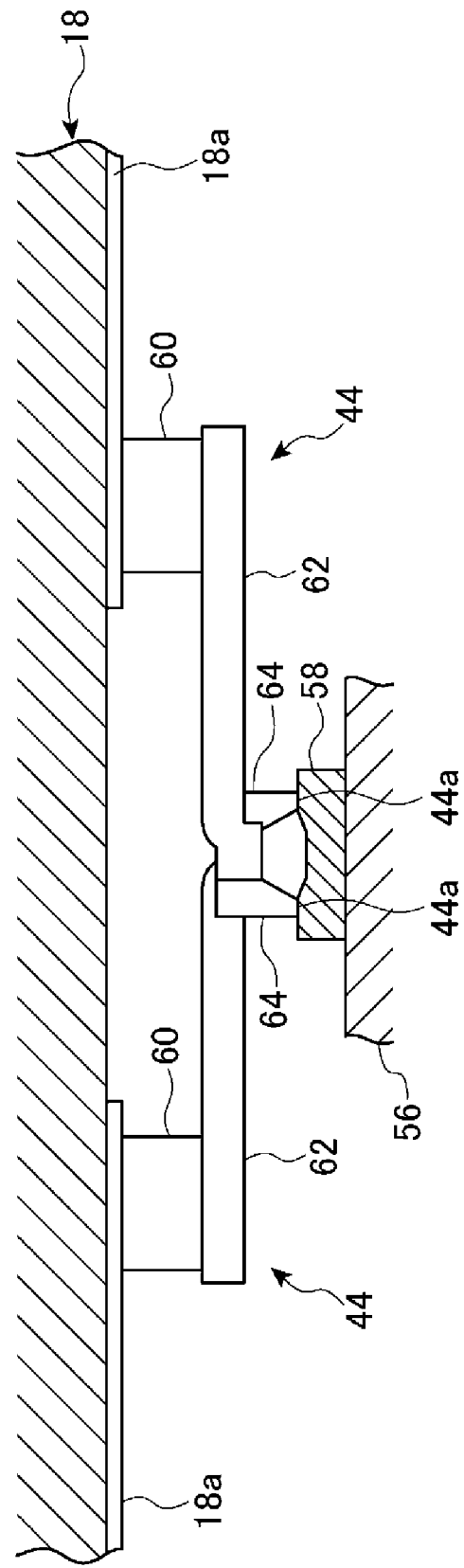
FIG. 3 is a sectional view showing an essential part of the electrical connecting apparatus according to the present invention.

Each probe 44 provided on the probe board 18 includes, as shown in FIG. 3 in an enlarged state, a base portion 60 with one end fixed on the probe sheet 20, namely, the conductive path 18a of the probe board 18, an arm portion 62 extending laterally from the lower end of the base portion along the probe board 18, and a tip portion 64 integrally formed with the front end portion of the arm portion 62. The tip portion 64 extends in a direction away from the probe board 18, and at an extended end, i.e., the front end, the tip 44a constituted by a flat plane in the illustration is formed.

Figure 4:
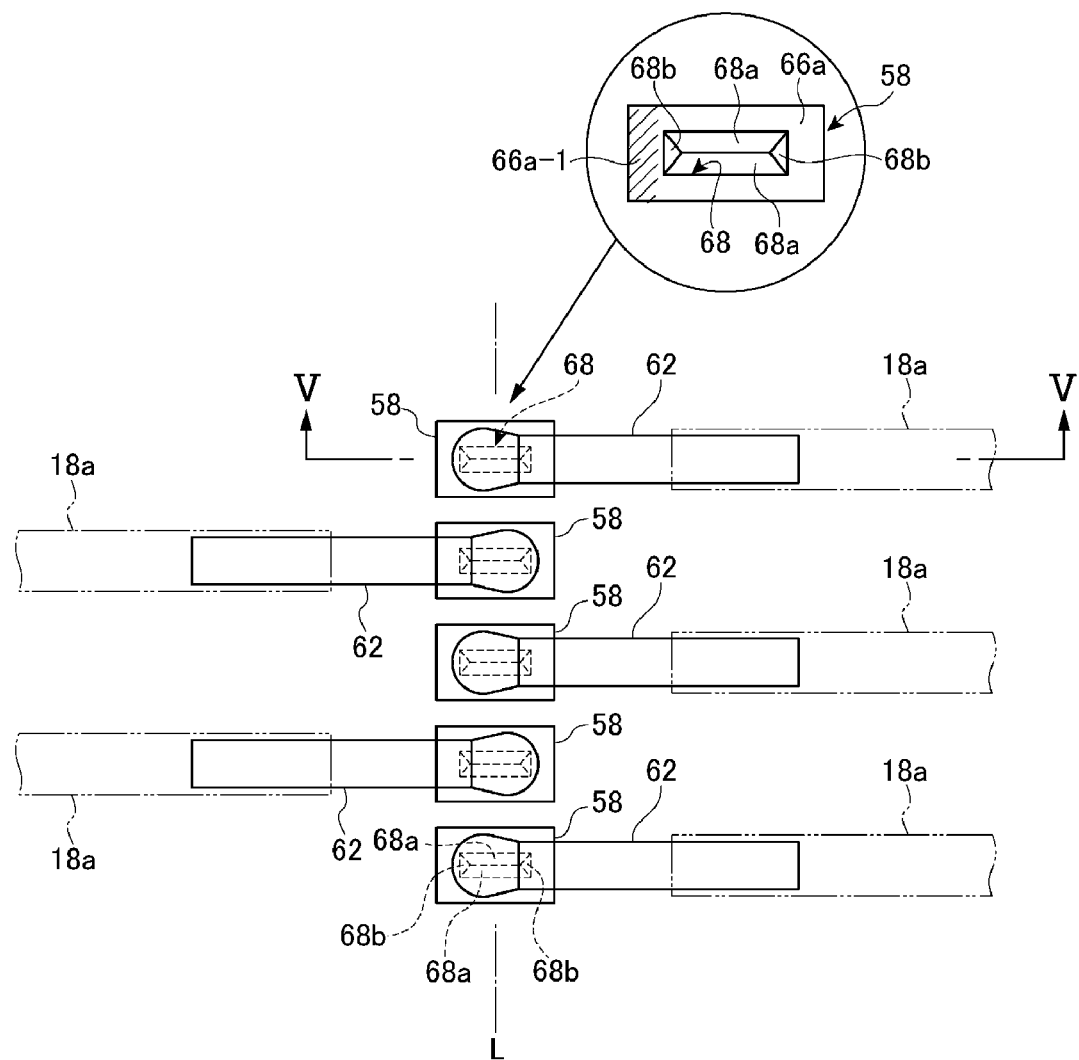
FIG. 4 is a plan view showing an example of arrangement of probes provided on the probe board except the probe board of the electrical connecting apparatus shown in FIG. 3.

FIG. 4 shows a planar arrangement of the probes 44, and in FIG. 4, the probe board 18 is omitted for simplification of the view. As evident from this FIG. 4, in order that the tips 44a may align on a straight line corresponding to a line L of alignment of the electrodes 58 provided on a semiconductor wafer 56, each arm 62 is arranged such that its longitudinal direction is orthogonal to the straight line (L). Thus, the respective probes 44 are arranged so as to make the tips 44a align in a straight line and the longitudinal direction of the arm portions 62 substantially orthogonal to the arrangement direction of the tips 44a. Also, the probes 44 are arranged such that the direction from the base portions 60 to the tip portions 64 become alternately reversed to the arrangement direction of the tips 44a.

In the illustration, the imaginary extension line of the longitudinal axis of each arm portion 62 is able to intersect the axis passing substantially through the center of the upside 66 of the corresponding electrode 58. By this, as shown in FIG. 4, the electrical connecting apparatus 10 can be positioned such that the tip 44a of the probe 44 is surely located above the corresponding electrode 58 provided on the semiconductor wafer 56.

Figure 5:
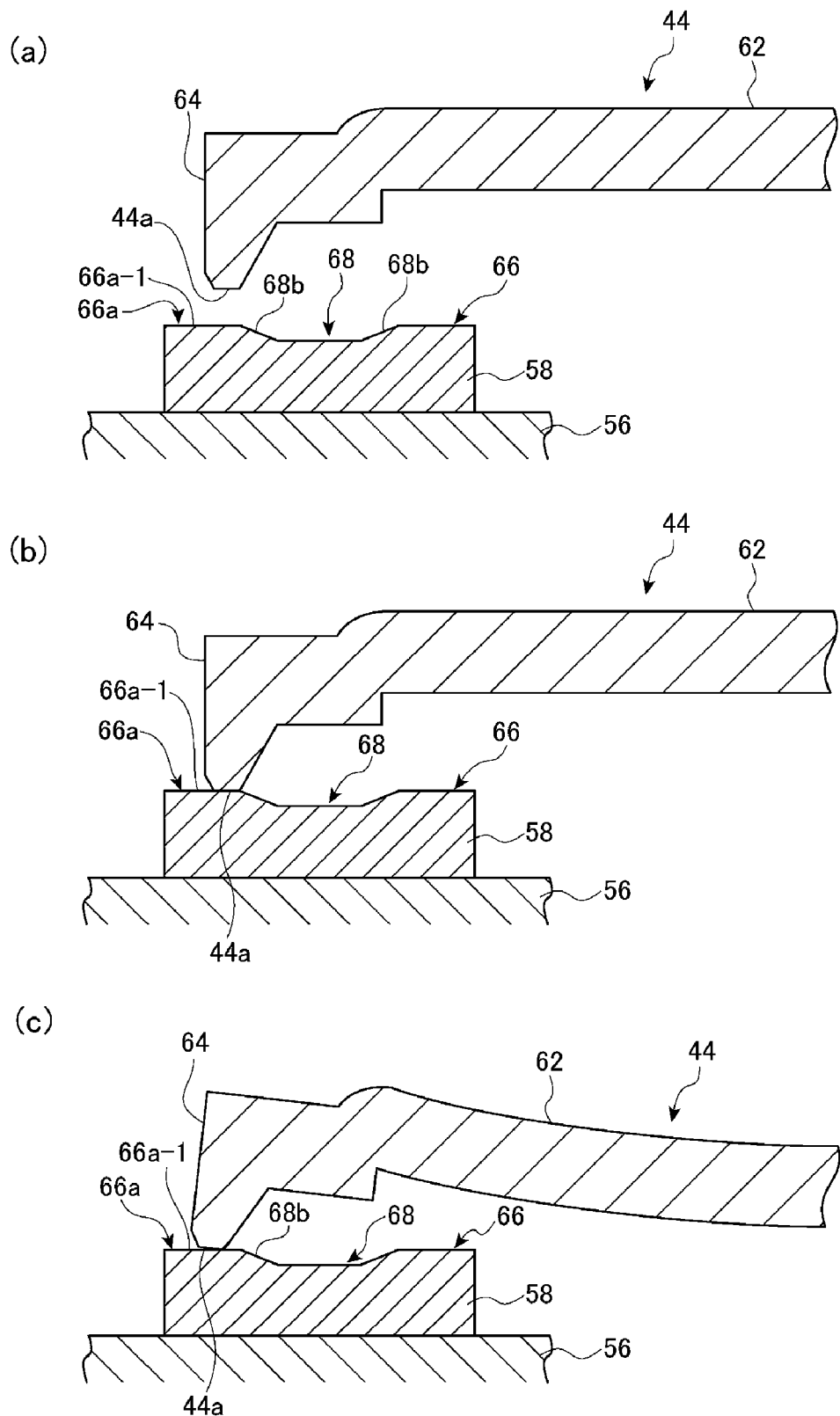
FIGS. 5(a), (b) and (c) are sectional views obtained along the line V-V shown in FIG. 4 to explain the movement of each probe in FIG. 4, wherein (a) shows a probe with its tip held on a corresponding bump electrode under non-loaded state; (b) shows a state that the probe tip is brought into contact with the bump electrode where no overdrive force is acting on the probe; and (c) shows a state where the overdrive force caused the probe tip to slide on the bump electrode.
Figure 6:
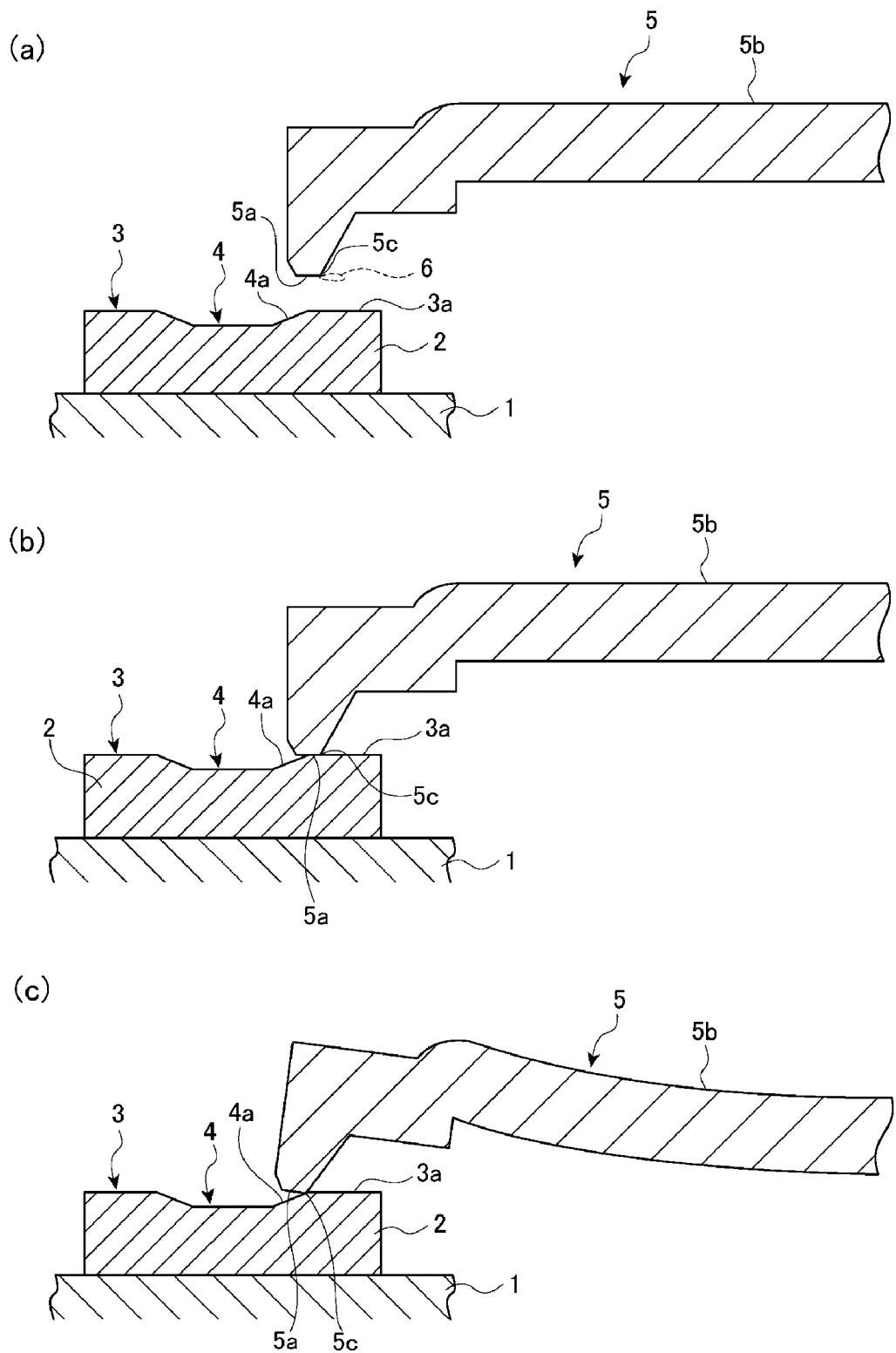
FIGS. 6(a), (b) and (c) are views similar to FIGS. 5(a), (b) and (c) for explaining the movement of the probe of the conventional electrical connecting apparatus.

The electrode 58 located below the tip 44a of each probe 44 is a so-called bump electrode, and as shown in FIGS. 4 and 5, has a flat upside 66 having a rectangular planar configuration, formed with a recess 68 rectangular in sectional shape similar to its outer shape. Each recess 68 is formed by peripheral walls (68a, 68b), that is, a pair of vertical inclined surfaces 68a along a pair of the long sides opposing each other as viewed on a plane, and lateral inclined surfaces 68b along a pair of short sides. Each of the inclined surfaces 68a, 68b is inclined toward the bottom portion of the recess 68.

On the upside 66 of the electrode 58 is formed a flat surface area 66a surrounding the recess 68. This flat surface area 66a continues to the upper edge of each inclined surface 68a, 68b, and forms a linear ridge with the upper edge.

As shown in FIG. 4, each probe 44 is disposed such that the axial direction of its arm portion 62 is along the longitudinal inclined surface 68a, and that, as shown in FIG. 5(a), each tip 44a is positioned above the one half located on the distal side from the base portion 60 of the probe 44, namely, the one half positioned on the side of the extending direction of the arm portion 62.

In more particular, as shown enlarged in the circled area in FIG. 4, of the rectangular frame-like flat surface area 66a, each tip 44a is located above an area part 66a-1 shown by hatched lines adjacent to one inclined surface 68b side located on the distal side from the base portion 60 of the corresponding probe 44.

In this state, since the tip 44a is held at a distance from the electrode 58, the arm portion 62 is in a free state and maintained substantially linearly without causing any elastic deformation.

When the electrical connecting apparatus is relatively moved toward the semiconductor wafer 56, as shown in FIG. 5(b), the tip 44a contacts the upside 66 of the electrode 58. At the time of this contact, no overdrive force acts on the probe 44, so that elastic deformation accompanying deflection is not introduced into the arm portion 62. At this time, as explained above, the tip 44a, being in a position corresponding to the area part 66a-1 of the flat surface area 66a, contacts the upside 66 of the electrode 58 at this area part 66a-1.

Further, when subsequently the electrical connecting apparatus 10 is relatively moved toward the semiconductor wafer 56, as shown in FIG. 5(c), the overdrive force acts on the probe 44, thereby causing the arm portion 62 an elastic flexural deformation due to this overdrive force. By this deflection of the arm portion 62, the tip 44a of each probe 44 slides on the flat surface area 66a from the contact point on the area part 66a-1 in the extension direction of the arm portion 62.

At this time, in the electrical connecting apparatus 10 according to the present invention, since the tip 44a of each probe 44 contacts the flat surface area 66a at the flat surface area part 66a-1 located on the side of the extending direction of the arm portion 62 as mentioned above, each tip 44a moves on the flat surface area 66a formed on the upside 66 of the corresponding electrode 58 in a direction to be away from the one lateral inclined surface 68b adjacent to the area part 66a-1.

Therefore, the tip 44a of each probe 44, sliding as heretofore on the upside 66 of the corresponding electrode 58, removes the oxide film of the upside 66 of the electrode 58. Thus, as heretofore, sure electrical connection between each probe 44 and the corresponding electrode 58 can be obtained.

This movement of the tip 44a is made in a direction to be away from the lateral inclined surface 68b of the recess 68 on the area part 66a-1, so that there is no sliding out of the tip 44a onto the inclined surfaces 68a, 68b of the recess 68 by the movement of the tip 44a. Consequently, when the tip 44a of the probe 44 is returned to the restoration position shown in FIG. 5(b) by cancellation of the overdrive force, it slides only on the area part 66a-1, and does not pass the ridge with the recess 68 as heretofore, so that there is no scraping off the ridge part of the electrode 58 by the edge of the tip 44a of the probe 44.

As a result, it is possible to surely prevent short circuiting due to a damage to the ridge part of the electrode as before.

In the above-mentioned electrical connecting apparatus 10, in order to obtain a probe sheet 20 (probe board 18) to correspond to the fine arrangement pitch of the electrodes 58 of a device under test 56 against which the tip 44a which is the front end of the tip portion 64 of each probe 44 is pressed, it is desirable to use a photolithography technique in production of the probe sheet 20. Concretely, by piling up probe materials in order, directing a plurality of probes 44 from their tips 44a toward the base portion 60, thereby forming the plural probes 44 collectively.

The present invention is not limited to the above embodiments but can be varied without departing from its purport. For instance, it is possible to move the tip 44a of each probe 44 on both side parts adjacent to a pair of longitudinal inclined surfaces 68a in the flat surface area 66a of the upside 66 of the electrode 58.

Also, while an example that the peripheral surface of the recess 68 is made of a pair of the longitudinal inclined surfaces 68a and a pair of the lateral inclined surfaces 68b is schematically explained, the present invention makes it a purpose to move the tip 44a within the flat surface area 66a of the upside 66 of the electrode 58 irrespective of the configuration of the peripheral surface of the recess 68, so that it can be applied to an electrical connecting apparatus of a device under test provided with electrodes with recesses of various shapes other than the bump electrode.

What is claimed is:

1. An electrical connecting system comprising:
 a device under test comprising a plurality of electrodes, each having a recess formed therein and a flat upper surface area surrounding the recess;
 a probe board provided with a plurality of probes for electrical inspection of the device under test, wherein the device under test is held in position with a designated alignment relative to the plurality of probes, wherein each of the plurality of probes comprises:
  a base portion joined to the probe board;
  an elastically deformable arm portion extending at a distance from the base portion along the probe board; and
  a tip portion projecting from the arm portion in a direction away from the probe board; wherein for each of the plurality of probes:
  the probe is positioned relative to the device under test such that, in the absence of flexural deformation of the arm portion, the tip portion contacts the flat upper surface area of an electrode without sliding into the recess; and
  the probe is positioned relative to the device under test such that, in response to flexural deformation of the arm portion caused by an overdrive force acting on the probe toward the device under test, the tip portion slides on the flat upper surface area of the electrode without departing from the flat upper surface area, and without sliding into the recess.

2. The electrical connecting system of claim 1, wherein for each of the plurality of probes:
 the probe is positioned relative to the device under test such that, in response to flexural deformation of the arm portion caused by the overdrive force, the tip portion slides on the flat upper surface area away from the recess.

3. The electrical connecting system of claim 1, wherein for each of the plurality of probes:
 the probe is positioned relative to the device under test such that, in response to flexural deformation of the arm portion caused by the overdrive force, the tip portion slides on the flat upper surface area adjacent to the recess.

4. A method for an electrical inspection of a device under test having a plurality of electrodes, each having a recess formed therein and a flat upper surface area surrounding the recess, the method comprising:
 providing a probe board having a plurality of probes configured for electrical inspection of the device under test, each of the probes comprising:
  a base portion joined to the probe board;
  an elastically deformable arm portion extending at a distance from the base portion along the probe board; and
  a tip portion projecting from the arm portion in a direction away from the probe board;
 holding the device under test in position with a designated alignment relative to the plurality of probes;
 positioning the probe board relative to the device under test and in the absence of flexural deformation of the arm portions of the probes, such that the tip portions of the probes contact the flat upper surface areas of the electrodes without sliding into the recesses; and
 applying an overdrive force on the probes toward the device under test to cause flexural deformation of the arm portions of the probes, such that, in response to the flexural deformation of the arm portions of the probes, the tip portions slide on the flat upper surface areas without departing from the flat upper surface areas, and without sliding into the recesses.

5. The method of claim 4, wherein, in response to the flexural deformation of the arm portions of the probes, the tip portions slide on the flat upper surface areas away from the recesses.

6. The method of claim 4, wherein, in response to the flexural deformation of the arm portions of the probes, the tip portions slide on the flat upper surface areas adjacent to the recesses.

* * * * *